(12) United States Patent
Fang et al.

(10) Patent No.: US 11,467,211 B2
(45) Date of Patent: Oct. 11, 2022

(54) ERROR DETECTION ON INTEGRATED CIRCUIT INPUT/OUTPUT PINS

(71) Applicant: SIGNIFY HOLDING B.V., Eindhoven (NL)

(72) Inventors: Yuhong Fang, Eindhoven (NL); Mark Ciolek, Eindhoven (NL); Harshitha Gudipati, Eindhoven (NL); George Gruev, Eindhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 949 days.

(21) Appl. No.: 16/305,197

(22) PCT Filed: May 23, 2017

(86) PCT No.: PCT/EP2017/062409
§ 371 (c)(1),
(2) Date: Nov. 28, 2018

(87) PCT Pub. No.: WO2017/207352
PCT Pub. Date: Dec. 7, 2017

(65) Prior Publication Data
US 2021/0223313 A1     Jul. 22, 2021

Related U.S. Application Data

(60) Provisional application No. 62/343,998, filed on Jun. 1, 2016.

(30) Foreign Application Priority Data

Jun. 17, 2016 (EP) ..................................... 16174882

(51) Int. Cl.
*G01R 31/319* (2006.01)
*H05B 45/50* (2022.01)
(Continued)

(52) U.S. Cl.
CPC ... *G01R 31/31905* (2013.01); *G01R 31/3004* (2013.01); *G01R 31/31926* (2013.01);
(Continued)

(58) Field of Classification Search
CPC ............ G01R 31/2884; G01R 31/3004; G01R 31/31905; G01R 31/31926; G01R 31/67; H05B 41/2851; H05B 45/50
See application file for complete search history.

(56) References Cited

U.S. PATENT DOCUMENTS

| 4,459,693 A | 7/1984 | Prang et al. |
| 6,396,426 B1 | 5/2002 | Balard et al. |

(Continued)

FOREIGN PATENT DOCUMENTS

| CN | 101329379 A | 12/2008 |
| CN | 201269906 Y | 7/2009 |

(Continued)

OTHER PUBLICATIONS

Robert Bosch, "A Device and Method for Diagnosing the Digital Output PIN of a Controller", Sep. 25, 2018, pp. 1-11.

*Primary Examiner* — April Y Blair
*Assistant Examiner* — Sazzad Hossain
(74) *Attorney, Agent, or Firm* — Daniel J. Piotrowski

(57) ABSTRACT

A method for detecting error on an input/output (IO) pin of an integrated circuit includes using the input/output pin of the integrated circuit in a first mode by receiving or sending a first value as analog data or digital data. The input/output pin is toggled in a test mode after each instance of using the input/output pin in the first mode. The test mode includes providing a second value disparate from the first value during a set time after using the input/output pin in the first mode, receiving back during the set time a resulting value based on providing the second value, measuring the result- (Continued)

ing value, and identifying an error on the input/output pin of the integrated circuit based on the measured resulting value.

14 Claims, 8 Drawing Sheets

(51) Int. Cl.
    *G01R 31/30*     (2006.01)
    *G01R 31/28*     (2006.01)
    *G01R 31/64*     (2020.01)
    *H05B 41/285*     (2006.01)

(52) U.S. Cl.
    CPC ......... *H05B 45/50* (2020.01); *G01R 31/2884* (2013.01); *G01R 31/64* (2020.01); *H05B 41/2851* (2013.01)

(56) References Cited

U.S. PATENT DOCUMENTS

| | | |
|---|---|---|
| 2002/0135391 A1 | 9/2002 | Rearick et al. |
| 2005/0248477 A1 | 11/2005 | Jongsma et al. |
| 2007/0061640 A1 | 3/2007 | Arkin |
| 2007/0143047 A1* | 6/2007 | Rearick .............. G01R 31/2818 702/64 |
| 2008/0265262 A1 | 10/2008 | Mollet |
| 2010/0045328 A1 | 2/2010 | Suto |
| 2011/0148429 A1 | 6/2011 | Minemier |
| 2011/0187384 A1 | 8/2011 | Casarsa |
| 2011/0234105 A1 | 9/2011 | Castiglia et al. |
| 2011/0248649 A1* | 10/2011 | Gokingco ............. G01S 7/4811 315/307 |
| 2012/0176141 A1 | 7/2012 | Mikami et al. |
| 2012/0235585 A1 | 9/2012 | Lys et al. |
| 2014/0022913 A1 | 1/2014 | Mizoguchi |
| 2015/0102950 A1 | 4/2015 | Karner |

FOREIGN PATENT DOCUMENTS

| | | |
|---|---|---|
| CN | 202494750 U | 10/2012 |
| CN | 104198911 A | 12/2014 |
| JP | H07113850 A | 5/1995 |

* cited by examiner

ERROR DETECTION ON INTEGRATED CIRCUIT INPUT/OUTPUT PINS

CROSS-REFERENCE TO PRIOR APPLICATIONS

This application is the U.S. National Phase application under 35 U.S.C. § 371 of International Application No. PCT/EP2017/062409, filed on May 23, 2017, which claims the benefits of European Patent Application No. 16174882.7, filed on Jun. 17, 2016, and U.S. Application No. 62/343,998, filed on Jun. 1, 2016. These applications are hereby incorporated by reference herein.

BACKGROUND

1. Field of the Disclosure

The present disclosure relates to the field of integrated circuits. More particularly, the present disclosure relates to the field of error detection on integrated circuit input/output pins.

2. Background Information

Integrated circuits include processors and microprocessors such as microcontrollers. Microcontrollers have pins which can become stuck, or which can be misaddressed in, for example, an analog input mode. Conventionally, 2 channels are used to detect stuck pins or misaddressing so as to invoke protection.

US2002/0135391, US2008/0265262, US2011/0148429 and US2011/0234105 show different manner for monitoring an output value using a feedback loop. Such feedback loop are part of an integrated circuit providing the output value.

SUMMARY OF THE INVENTION

The invention provides a solution to pin stuck detection on input/output pin of an integrated circuit including a microprocessor. The input/output pin of the integrated circuit being linked to an input node. The input node receives an input signal through at least one resistor and is connected to a reference voltage through a second resistor and to zero volt through a third resistor. The method comprising:
  using the input/output pin of the integrated circuit in input mode by receiving a first value as analog data or digital data; and
  toggling the input/output pin in a test mode after each of a plurality of instances of using the input/output pin in the input mode,
  wherein the test mode comprises using the input/output pin as an output providing a second value disparate from the first value during a set time after using the input/output pin in the input mode, receiving back during the set time a resulting value based on providing the second value, measuring the resulting, and identifying an error on the input/output pin of the integrated circuit based on the measured resulting value.

According to a preferred embodiment, the method further comprising:
  outputting a pulse to provide the second value as an output pulse value at an output of the integrated circuit in the test mode;
  reading the output pulse internally to receive back the resulting value by obtaining the output pulse value;
  measuring the output pulse value as the measured resulting value; and
  comparing the output pulse value read from the output with the second value,
  wherein the identified error is identified based on the comparing.

According another aspect, the invention relates to a control circuit which comprises an integrated circuit, a first resistor, a second resistor and a third resistor. The integrated circuit includes a microprocessor operable to execute instructions to detect errors on an input/output pin of the integrated circuit, the input/output pin of the integrated being linked to an input node. The first resistor is connected to the input node and receiving an input signal. The second resistor is connected between a reference voltage and the input node. The third resistor connected between a zero voltage and the input node.

Preferentially, the control circuit may comprise a fourth resistor linking the input/output pin of the integrated circuit to the input node. The control circuit may comprise a capacitor connected in parallel with the third resistor.

According to a specific application, the control circuit is in an output section of a light emitting diode driving circuit having a primary control section and the output section isolated from the primary control section.

According to a preferred embodiment, when executed by the microprocessor, the instructions cause the light emitting diode driving circuit to perform a process comprising:
  using the input/output pin of the integrated circuit in an input mode by receiving a first value as analog data or digital data; and
  toggling the input/output pin in a test mode after each of a plurality of instances of using the input/output pin in the first mode,
  wherein the test mode comprises using the input/output pin at an output providing a second value disparate from the first value during a set time after using the input/output pin in the input mode, receiving back during the set time a resulting value based on providing the second value, measuring the resulting value, and identifying an error on the input/output pin of the microprocessor based on the measured resulting value.

DETAILED DESCRIPTION

In view of the foregoing, the present disclosure, through one or more of its various aspects, embodiments and/or specific features or sub-components, is thus intended to bring out one or more of the advantages as specifically noted below.

The present disclosure describes a microcontroller that can perform error detection for pins. When a microcontroller is used to control a light emitting diode driving circuit to meet UL Class 2 requirements and temperature Class P requirement, the software needs to be compatible with UL 60730 compatible. The microcontroller described herein can detect if pins are stuck at high level or low level, and if analog input multiplexer addressing is wrong. When errors are detected, protection can be triggered. The disclosure contained herein describes, for example, how to detect a stuck input/output pin configured for digital output, as well as wrong multiplexer addressing for analog input pin.

Methods described herein are illustrative examples, and as such are not intended to require or imply that any particular process of any embodiment be performed in the order presented. Words such as "thereafter," "then," "next," etc. are not intended to limit the order of the processes, and these words are instead used to guide the reader through the description of the methods. Further, any reference to claim elements in the singular, for example, using the articles "a," "an" or "the", is not to be construed as limiting the element to the singular.

Additionally, terms such as microprocessor and microcontroller may be used interchangeably herein. In the absence of explanations distinguishing such terms, similar and comparable terms such as these should be considered equivalent for the purposes of the explanations provided herein. In the example of a microprocessor, any microprocessor described herein may also be, for example, a microprocessor chip, or a controller.

Figure 1:
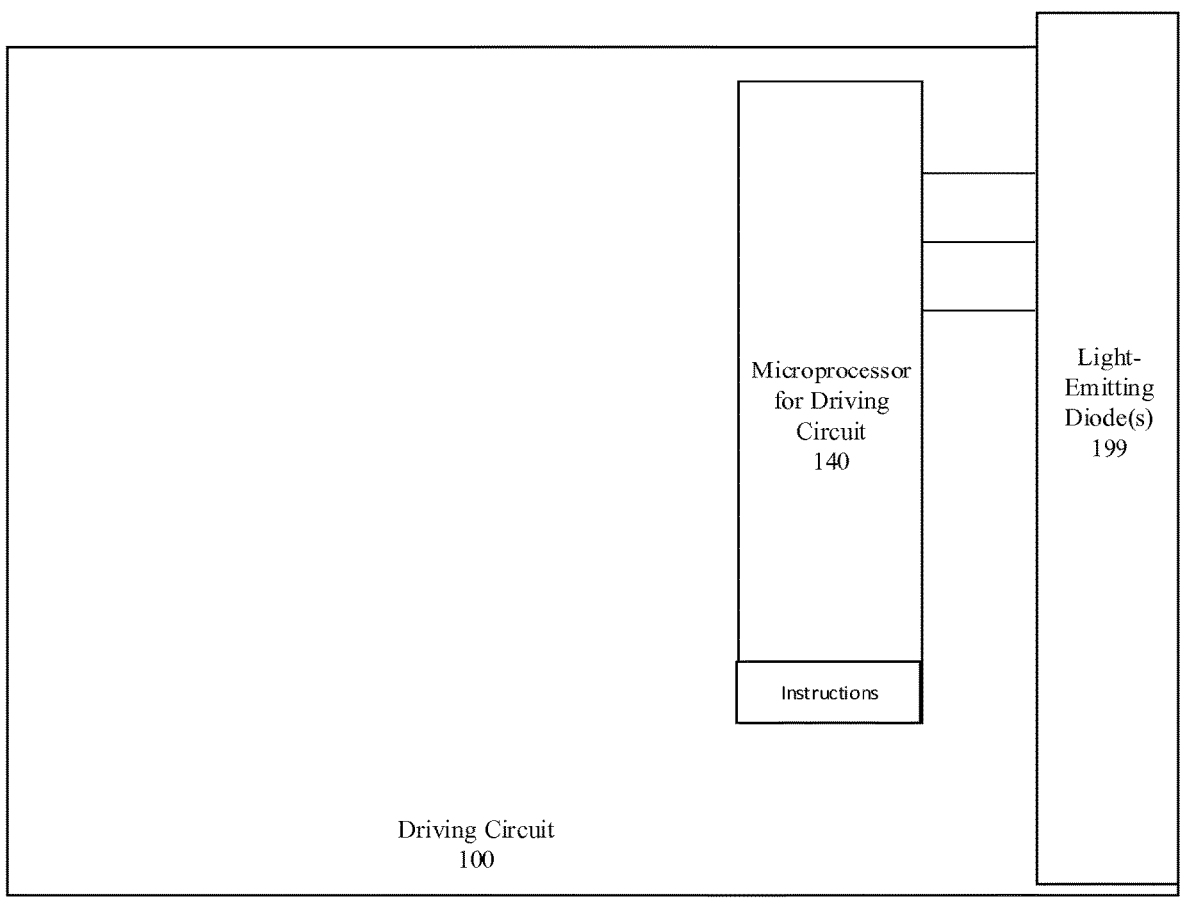
FIG. 1 shows an exemplary electronic device that includes a driving circuit with a microprocessor with input/output pins, according to an aspect of the present disclosure.

FIG. 1 shows an exemplary electronic device that includes a driving circuit with a microprocessor. In FIG. 1, the electronic device 10 is a device that includes a microprocessor 140. The microprocessor 140 in FIG. 1 is shown as part of a driving circuit, for driving loads imposed by light emitting diode(s) 199.

An example of the electronic device 10 is a device that includes light emitting diodes driven by a driving circuit. The driving circuit may be designed to comply with UL Class 2 LED Driver requirements, and can help ensure that parameters of the driving circuit meet such requirements. Such a driving circuit may include a primary control section and an output section isolated in at least one aspect from the primary control section.

Electronic device 10 may be, for example, a lighting fixture, an entertainment display, a communications device, and more. Such devices can also include electronic devices with memory and additional microprocessors beyond the microprocessor 100 specific to the output section 100b of the driving circuit 100. Such devices may operate as standalone devices or may be connected, for example, using a network, to other devices or systems.

The electronic device 10 can be incorporated as or in a particular device that in turn is in an integrated system that includes additional devices. In a particular embodiment, the electronic device 10 can be implemented using electronic devices that provide voice, video or data communication. Further, while a single electronic device 10 is illustrated, the electronic device 10 may be included in a "system" that includes any collection of systems or sub-systems that individually or jointly execute a set, or multiple sets, of instructions to perform one or more computer software functions.

A microprocessor as described herein is tangible and non-transitory. As used herein, the term "non-transitory" is to be interpreted not as an eternal characteristic of a state, but as a characteristic of a state that will last for a period of time. The term "non-transitory" specifically disavows fleeting characteristics such as characteristics of a particular carrier wave or signal or other forms that exist only transitorily in any place at any time. A microprocessor is an article of manufacture and/or a machine component. A microprocessor for an electronic device 10 is configured to execute software instructions in order to perform functions as described in the various embodiments herein. A microprocessor for an electronic device 10 may be a general purpose microprocessor or may be part of an application specific integrated circuit (ASIC). Additionally, any microprocessor described herein may include multiple microprocessors, parallel microprocessors, or both. Multiple microprocessors may be included in, or coupled to, a single device or multiple devices.

Moreover, devices described herein may include storage such as a memory. Memories described herein are tangible storage mediums that can store data and executable instructions, and are non-transitory during the time instructions are stored therein. A memory described herein is an article of manufacture and/or machine component. Memories described herein are computer-readable mediums from which data and executable instructions can be read by a processor. Memories as described herein may be random access memory (RAM), read only memory (ROM), flash memory, electrically programmable read only memory (EPROM), electrically erasable programmable read-only memory (EEPROM), registers, or any other form of storage medium known in the art. Memories may be volatile or non-volatile, secure and/or encrypted, unsecure and/or unencrypted.

In a particular embodiment, a device described herein may include a computer-readable medium in which one or more sets of instructions, for example, software, can be embedded. Sets of instructions can be read from the computer-readable medium. Further, the instructions, when executed by a microprocessor, can be used to perform one or more of the methods and processes as described herein. In a particular embodiment, the instructions may reside completely, or at least partially, within a separate memory, and/or within the microprocessor during execution by a device.

In an alternative embodiment, dedicated hardware implementations, such as application-specific integrated circuits (ASICs), programmable logic arrays and other hardware components, can be constructed to implement one or more of the methods described herein. One or more embodiments described herein may implement functions using two or more specific interconnected hardware modules or devices with related control and data signals that can be communicated between and through the modules. Accordingly, the present disclosure encompasses software, firmware, and hardware implementations. Nothing in the present application should be interpreted as being implemented or implementable solely with software and not hardware such as a tangible non-transitory microprocessor and/or memory.

In accordance with various embodiments of the present disclosure, the methods described herein may be implemented using a microprocessor that executes software programs. Further, in an exemplary, non-limited embodiment, implementations can include distributed processing, component/object distributed processing, and parallel processing.

Figure 2:
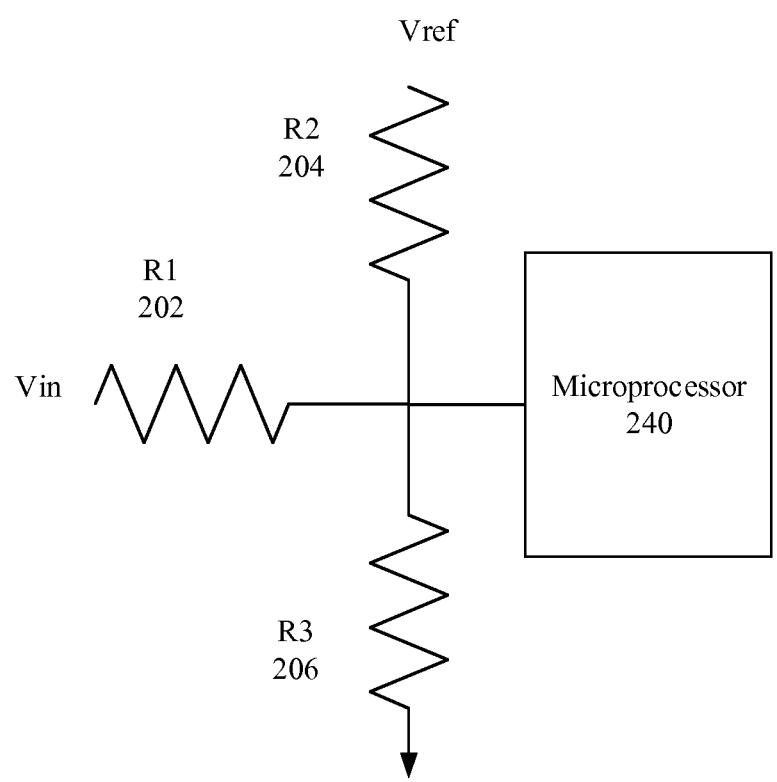
FIG. 2 shows an exemplary circuit with a microprocessor, according to an aspect of the present disclosure.

FIG. 2 shows an exemplary circuit with a microprocessor, according to an aspect of the present disclosure. In FIG. 2, the microcontroller 240 is a microprocessor with a pin stuck for analog input. The circuit includes three resistors including R1 202, R2 204 and R3 206. Vin is input via R1. To detect the stuck analog input pin, an offset voltage is added to the analog input, and the input range is scaled down. A valid range for Vin may be zero (0) to Vref. When input voltage Vin is within a valid range, the voltage range at the analog input pin will be from Voffset1 to Vref minus (−) Voffset2. When the analog input pin is stuck to a high level, the measured voltage will be equal to or close to Vref. When the analog input pin is stuck to a low level, the measured voltage will be equal or close to zero. Therefore, the microprocessor can perform a process of checking measured voltage levels via the analog input pin, and identifying when a pin is stuck by determining when measured voltage is at or approximately Vref or zero.

Figure 3:
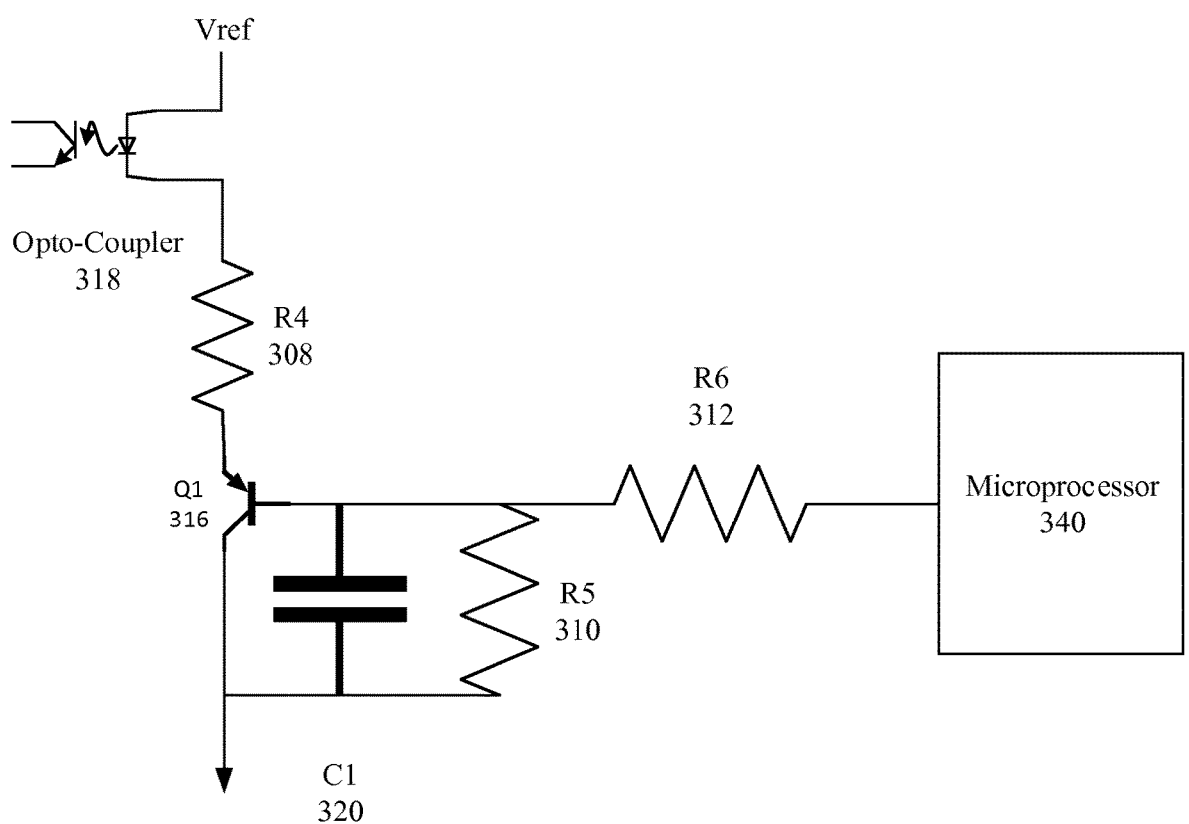
FIG. 3 shows another exemplary circuit with a microprocessor, according to an aspect of the present disclosure.

FIG. 3 shows another exemplary circuit with a microprocessor, according to an aspect of the present disclosure. In the embodiment of FIG. 3, a microcontroller 340 is provide in a circuit with an opto-coupler 318, three resistors including R4 308, R5 310 and R6 312, a capacitor C1 320, and a transistor Q1 316.

In the embodiment of FIG. 3, a digital output pin that is stuck can be detected. When the digital output is to be set high, the microprocessor 340 will set the digital output pin to a high level with a very narrow low level pulse. In the embodiment of FIG. 3, a narrow low level pulse is used instead of continuously setting the pin to the high level. The microprocessor then reads back from the pin while the narrow low level pulse is in process to detect if the digital output pin is stuck.

When the digital output is to be set low, the microprocessor 340 will set the digital output pin to a low level with a very narrow high level pulse. In the embodiment of FIG. 3, a narrow high level pulse is used for this purpose instead of continuously setting the pin to the low level. The microprocessor then reads back from the pin while the narrow high level pulse is in process to detect if the digital output pin is stuck.

Additionally, in FIG. 3, an external filter circuit as shown by the circuitry around the microprocessor 340 filters the output narrow low level pulse or output narrow high level pulse as a hardware protection circuit to protect other hardware. Alternatively, a circuit driven by the digital output pin can be designed in a way so as not to respond to a narrow low level pulse.

Figure 4:
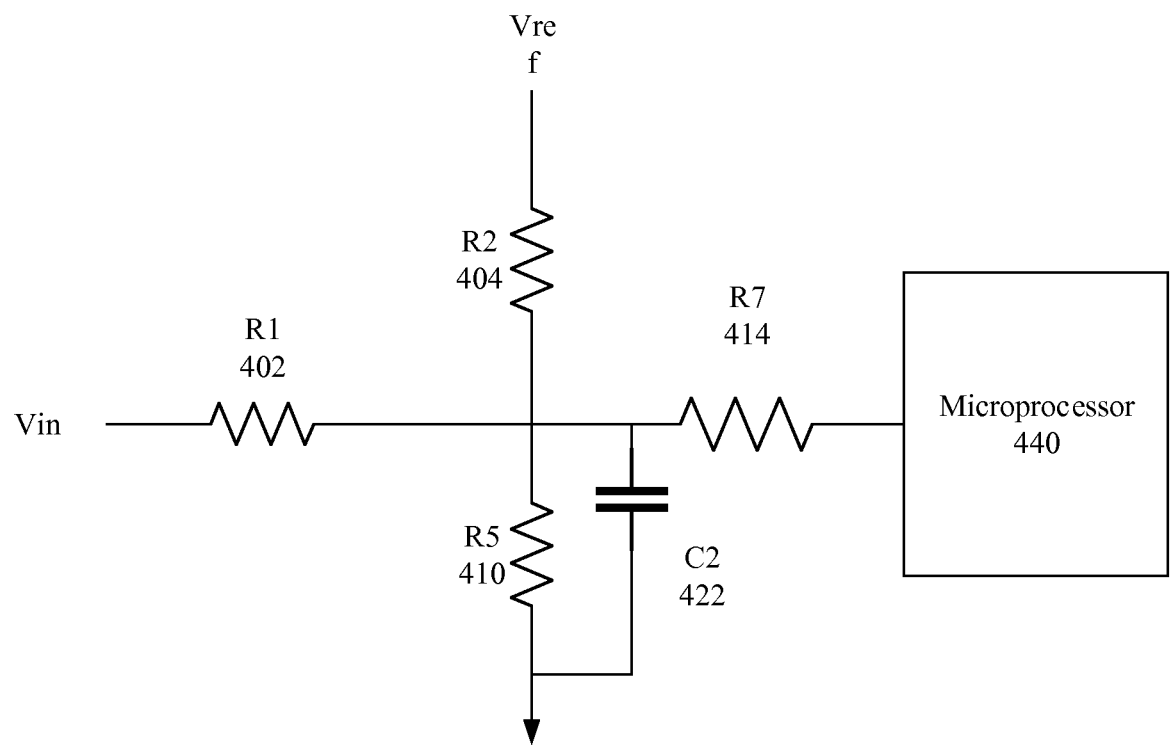
FIG. 4 shows an exemplary circuit with a microprocessor, according to an aspect of the present disclosure.

FIG. 4 shows another exemplary circuit with a microprocessor, according to an aspect of the present disclosure. In FIG. 4, wrong multiplexer addressing is detected for an analog input pin. In FIG. 4, the circuit includes four resistors including R1 402, R2 404, R5 410 and R7 414. The circuit also includes capacitor C3 and microcontroller 440

In the embodiment of FIG. 4, after an analog input is converted via analog to digital conversion, the microcontroller 440 reconfigured to analog input pin for digital output. The microcontroller then sets the pin to either a high level or a low level depending on the value of the received analog input. That is, the microcontroller sets the value to be different than the received analog input.

In the embodiment of FIG. 4, after setting the reconfigured digital output pin to a level different from the value of the analog input received before the reconfiguration, the invented method is: after completing ADC conversion, the microcontroller configures the pin to digital output and sets the pin to high or low level. After setting the level of the pin, the capacitor C2 is connected to the pin to maintain the voltage for a short time, insofar as the voltage at the pin reflects the value set by the microcontroller. The short time may be a predetermined period. During the short time, the microcontroller is reconfigured for analog input. The reconfigured analog pin then measures input voltage, which is the voltage maintained by the capacitor. If the voltage follows the digital output value set by the microprocessor 440, the addressing of the channel for the pin is correct in the analog input mode. Otherwise, the addressing for the pin in the analog input mode is determined to be incorrect.

Figure 5:
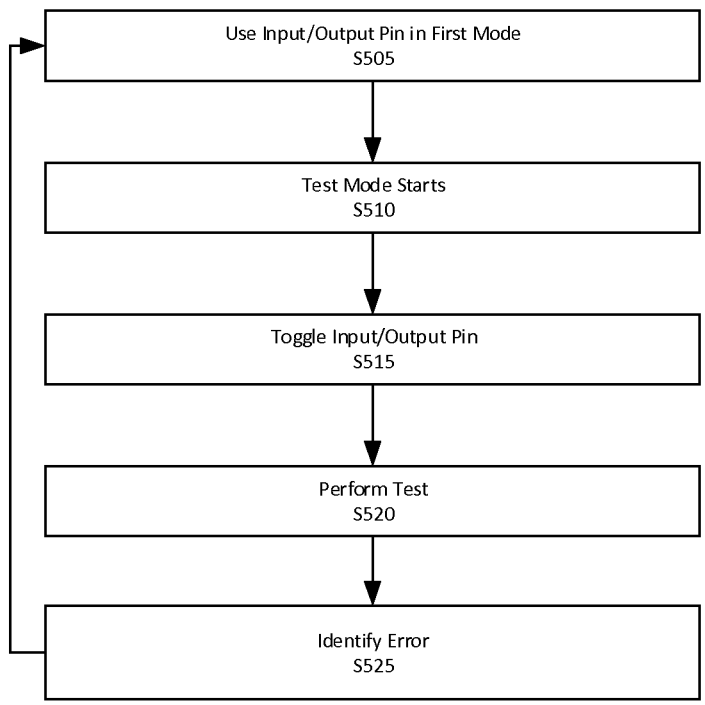
FIG. 5 shows an exemplary process for error detection on integrated circuit input/output pins, according to an aspect of the present disclosure.

FIG. 5 shows an exemplary process for error detection on integrated circuit input/output pins, according to an aspect of the present disclosure. In FIG. 5, an overview of the error detection methods described herein is shown. This overview applied to multiple different embodiments described herein.

At S505, an input/output pin of an integrated circuit is used in a first mode. This first mode may be described, for example, as the normal mode, or the mode for which the input/output pin is configured. At S510, a test mode starts. The test mode may be started at S510 after each instance of using the input/output pin in the first mode. For example, the test mode may be used after each of a set (e.g., 5) of instances of using the input/output pin the first mode.

At S515, the input/output pin is toggled. The toggling at S515 may mark the beginning of the test mode, or may be considered the first operation in the test mode. At S520, the input/output pin is tested. At S525 an error is identified. After identifying an error at S525, the process returns to S505 where the input/output pin is used in the first mode again.

Toggling at S515 may be performed by changing a value set for the input/output pin. Alternatively, toggling at S515 may be performed by reconfiguring the functionality of the input/output pin, such as by reconfiguring an input/output pin being used for analog input to a use for digital output.

Additionally, although the overview shown in FIG. 5 shows the process returning to the first mode (normal use) at S505 after identifying an error at S525, the process may involve numerous alternative intermediate steps before returning to the first mode (normal use). For example, the integrated circuit that contains the input/output pin may be shut off, a circuit that contains the integrated circuit may be shut off, or a device that contains a circuit that contains the integrated circuit may be shut off. Additionally, an alarm or indicator warning of the error may be set to warn a user of the error. In some circumstances, a remedial action may be taken automatically to provide a remedy for an error, such as by sending a pulse to reset a pin. In any event, FIG. 5 is an overview of the process, and does not show details that happen between major stages of the process described herein.

Figure 6:
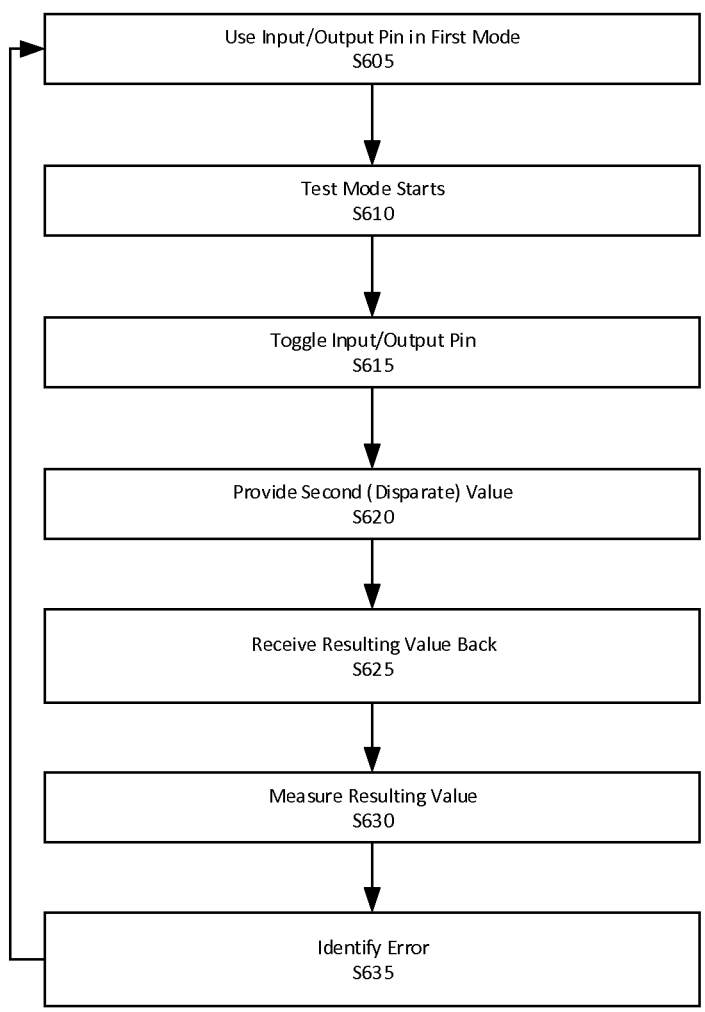
FIG. 6 shows another exemplary process for error detection on integrated circuit input/output pins, according to an aspect of the present disclosure

FIG. 6 shows another exemplary process for error detection on integrated circuit input/output pins, according to an aspect of the present disclosure. The embodiment of FIG. 6 corresponds to both the circuits shown in FIG. 3 and in FIG. 4, and starts with using an input/output pin in a first mode at S605. At S610, a test mode starts, and at S615 an input/output pin is toggled. At S620, a second, disparate value from the previous setting is newly set. At S625, a resulting value is received back, and at S630 the resulting value is measured. At S635 the error is identified based on the actions taken from S615 to S630. Afterwards (later) the process returns to the first mode (normal use) at S605.

Providing a second, disparate value at S620 may be performed in several different ways. For instance, value set by a received signal may be identified, so that the pin can be set with a different level at S620. Alternatively, a previous value set for an input/output pin configured for output may be considered a first value, and the second, disparate value may be set to ensure that the pin is not stuck at the previous (first) level.

Additionally, the actions at S625 and S630 may be performed in several different ways. For instance, a pin may be set with a level, and then the level can be immediately read to ensure that the pin correctly reflects the intended setting. The pin may be set to a second, disparate level by an output pulse and then immediately read back, or may be set to a second, disparate level and then used to charge a capacitor which is then immediately read back. In any event, the activities at S625 and S635 are performed using the input/output pin in question, and not two pins in these embodiments.

Figure 7:
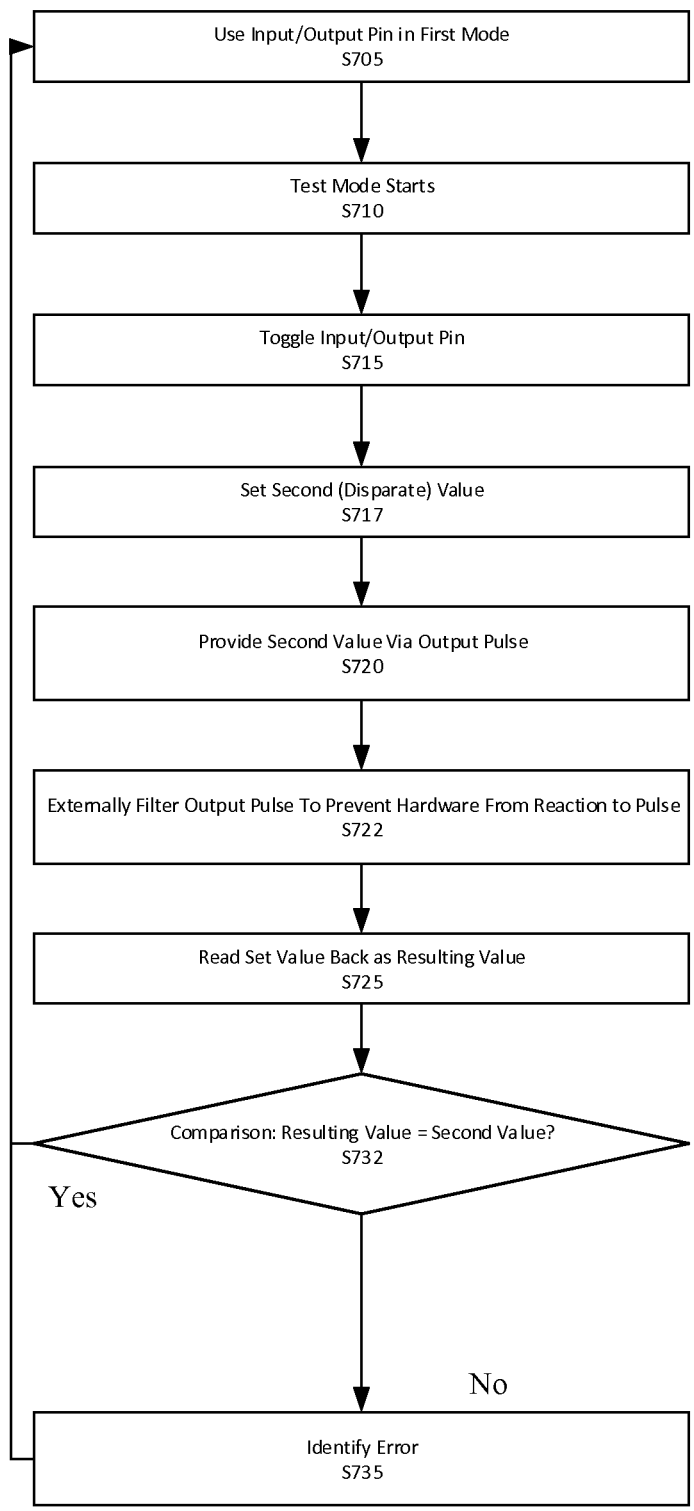
FIG. 7 shows another exemplary process for error detection on integrated circuit input/output pins, according to an aspect of the present disclosure.

FIG. 7 shows another exemplary process for error detection on integrated circuit input/output pins, according to an aspect of the present disclosure. In FIG. 7, the process starts at S705 when an input/output pin is used in a first mode. At S710 the test mode starts. At S715, the input/output pin is toggled, and at S717 the pin is set to a second, disparate value. At S720, the second value is provided via an output pulse. In the embodiment of FIG. 7, the actions at S715 to S735 are to identify whether a pin configured for digital input is stuck at a level.

The output pulse is set very narrow, and is low level if the pin is to be set to a high level, and is high level if the pin is to be set to a low level. At S722, the output pulse is externally filtered. The output pulse is filtered in the manner explained with respect to FIG. 3, in order to protect other hardware in the circuit that includes the microprocessor with the pin in question.

At S725 the set value is read back as a resulting value. At S732, the resulting value is compared with the second value. If the resulting value is the second value (S732=Yes), no error is identified, and the input/output pin is again used in the first mode at S705. On the other hand, if the resulting value does not equal the second value, then the pin is diagnosed as being stuck at the previous level.

Figure 8:
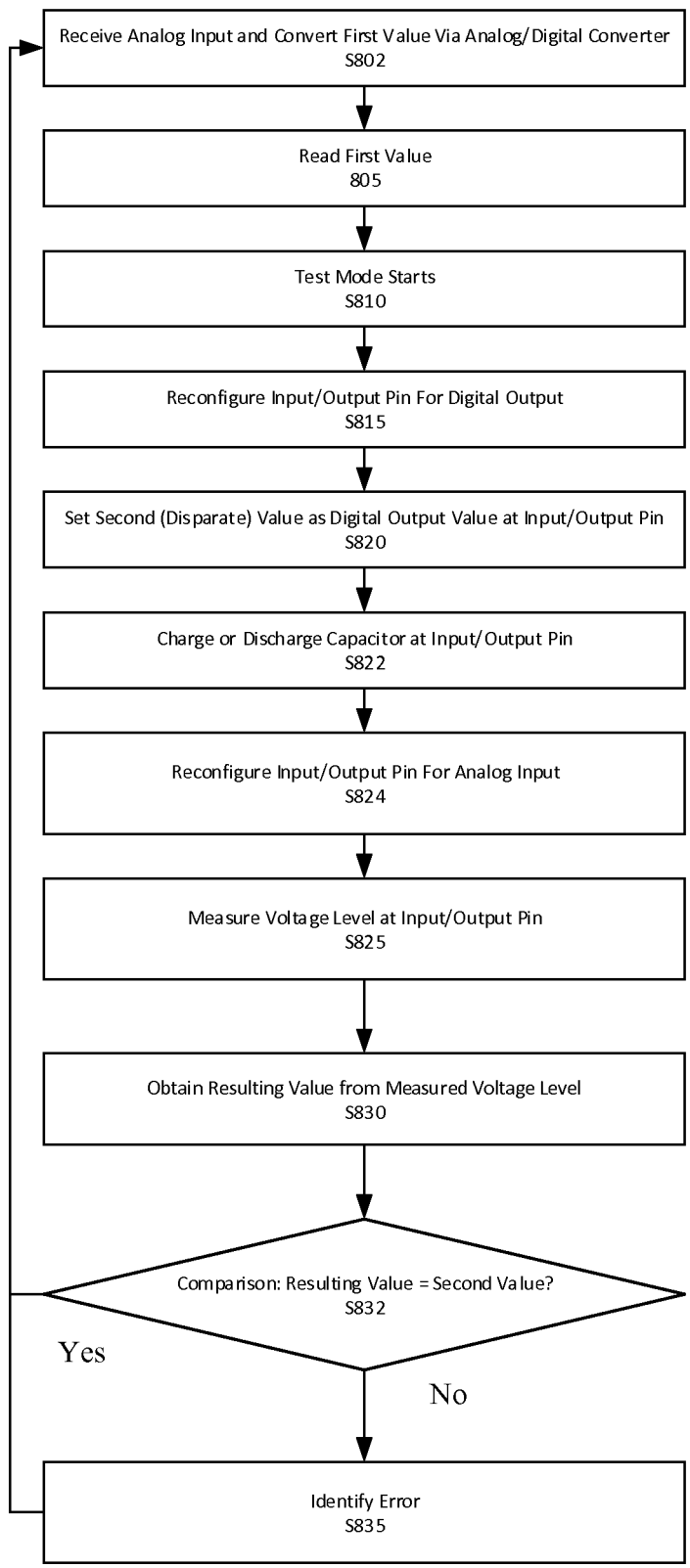
FIG. 8 shows another exemplary process for error detection on integrated circuit input/output pins, according to an aspect of the present disclosure.

FIG. 8 shows another exemplary process for error detection on integrated circuit input/output pins, according to an aspect of the present disclosure. In FIG. 8, an analog input is received at S802 and converted to a first value via an analog to digital converter. At S805, the first value is read.

At S810, the test mode starts. In the test mode, at S815 the input/output pin is reconfigured for digital output. For this embodiment, the toggling described earlier includes this reconfiguration.

At S820, a second, disparate value is set the digital output value at the input/output pin. At S822, the capacitor is connected to the input/output pin and charged or discharged to maintain the voltage value of the input/output pin. As described earlier, the voltage value of the input/output pin reflects the value set for the input/output pin.

At S824, the input/output pin is reconfigured for analog input. At S825, the voltage level of the capacitor is measured. The measured voltage level of the capacitor is effectively the voltage level of the input/output pin. At S830, the resulting value is obtained from the measured voltage level. At S832, a comparison is made as to whether the resulting level is the second value set at S820. If the resultant value is not the second value (S832=No) then the error is identified at S835. If the resultant value is the second value (S832=Yes), then there is no error and the process returns to S802 where the analog input is received and converted via an analog to digital converter.

After the error is identified at S835, the microprocessor may be shut down. As described previously, a circuit that includes the microprocessor may be shut down, or a device that includes such a circuit may even be shut down. Additionally, while a computer-readable medium is described generally as a single medium, the term "computer-readable medium" includes a single medium or multiple media that store one or more sets of instructions. The term "computer-readable medium" shall also include any medium that is capable of storing, encoding or carrying a set of instructions for execution by a microprocessor or that cause a computer system to perform any one or more of the methods or operations disclosed herein.

Although the present specification describes components and functions that may be implemented in particular embodiments with reference to particular standards and protocols, the disclosure is not limited to such standards and protocols. For example, standards such as UL 60730 represent examples of the state of the art. Such standards are periodically superseded by more efficient equivalents having essentially the same functions. Accordingly, replacement standards and protocols having the same or similar functions are considered equivalents thereof.

The illustrations of the embodiments described herein are intended to provide a general understanding of the structure of the various embodiments. The illustrations are not intended to serve as a complete description of all of the elements and features of the disclosure described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

According to an aspect of the present disclosure, a method for detecting error on an input/output (IO) pin of an integrated circuit includes using the input/output pin of the integrated circuit in a first mode by receiving or sending a first value as analog data or digital data. The method also includes toggling the input/output pin in a test mode after instances of using the input/output pin in the first mode. The test mode includes providing a second value disparate from the first value during a set time after using the input/output pin in the first mode, receiving back during the set time a resulting value based on providing the second value, measuring the resulting value, and identifying an error on the input/output pin of the integrated circuit based on the measured resulting value.

According to another aspect of the present disclosure, the method includes outputting a pulse to provide the second value as an output pulse value at an output of the integrated circuit in the test mode. The method also includes reading the output pulse internally to receive back the resulting value by obtaining the output pulse value, measuring the output pulse value as the measured resulting value; and comparing the output pulse value read from the output with the second value. The identified error is identified based on the comparing.

According to still another aspect of the present disclosure the using the input/output pin in the first mode includes reading the first value from a first received analog input from the input/output pin after conversion by an analog to digital converter. The toggling in the test mode includes reconfiguring the input/output pin first for digital output in the test mode after receiving the first received analog input. The providing includes setting the second value as a digital output value for output from the input/output pin reconfigured for digital output in the test mode during the set time. The method also includes charging or discharging a capacitor at the input/output pin reconfigured for digital output in the test mode to maintain a voltage level after setting the second value as the digital output value during the set time. The method also includes reconfiguring the input/output pin second for analog input again in the test mode after setting the second value as the digital output value during the set time. The voltage level is measured at the input/output pin to obtain the measured resulting value after conversion by the analog to digital converter. The measured resulting value obtained from the input/output pin is compared with the second value. The identified error is identified based on the comparing.

According to yet another aspect of the present disclosure, the integrated circuit includes a microcontroller used to control a light emitting diode driving circuit.

According to another aspect of the present disclosure, the light emitting diode driving circuit complies with class 2 requirements for light emitting diodes. The microcontroller complies with an Underwriter Laboratories 60730 standard.

According to still another aspect of the present disclosure, the identified error indicates that the input/output pin is stuck in a HIGH level or a LOW level when the input/output pin is used as a digital output pin. Pulses are used to set the input/output pin to an opposite level.

According to yet another aspect of the present disclosure, the method includes setting the input/output pin to the HIGH level from a LOW level using one of the pulses, reading back the resulting value, and identifying that the input/output pin is stuck in the LOW level based on the resulting value.

According to another aspect of the present disclosure, the method includes setting the input/output pin to the LOW level from a HIGH level using one of the pulses, reading back the resulting value; and identifying that the input/output pin is stuck in the HIGH level based on the measured resulting value.

According to still another aspect of the present disclosure, the identified error indicates that analog input multiplexer addressing is erroneous.

According to yet another aspect of the present disclosure, the method includes converting the first received analog input and the measured voltage level to digital output using the analog to digital converter; and setting the input/output pin reconfigured first for digital output to a HIGH level or a LOW level. The capacitor is connected to the input/output pin reconfigured for digital output to maintain the voltage level during the set time.

According to another aspect of the present disclosure, the method includes determining whether the measured voltage level at the input/output pin maintained by the capacitor indicates that the input/output pin is set to the HIGH level or the LOW level. The method also includes identifying an analog input multiplexer addressing error based on the determination and the comparing.

According to an aspect of the present disclosure, a light emitting diode driving circuit includes a primary control section and an output section isolated from the primary control section. The output section includes a microprocessor that is operable to execute instructions to detect errors on an input/output (IO) pin of the microprocessor. When executed by the microprocessor, the instructions cause the light emitting diode driving circuit to perform a process that includes using the input/output pin of the microprocessor in a first mode by receiving or sending a first value as analog data or digital data. The process also includes toggling the input/output pin in a test mode after instances of using the input/output pin in the first mode. The test mode includes providing a second value disparate from the first value during a set time after using the input/output pin in the first mode, receiving back during the set time a resulting value based on providing the second value, measuring the resulting value, and identifying an error on the input/output pin of the microprocessor based on the measured resulting value.

According to another aspect of the present disclosure, the first mode is a mode in which the microprocessor is primarily used.

According to still another aspect of the present disclosure, the input/output pin is configured for digital output, and the toggling includes changing a level of the input/output pin configured for digital output to a HIGH level or a LOW level based on the second value.

According to still another aspect of the present disclosure, the input/output pin is configured for analog input in the first mode, and the toggling comprises reconfiguring the input/output pin from being configured for analog input to being configured for digital output.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The preceding description of the disclosed embodiments is provided to enable any person skilled in the art to make or use the present disclosure. As such, the above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

The invention claimed is:

1. A method for detecting error on an input/output pin of an integrated circuit by a microprocessor of said integrated circuit, the input/output pin of the integrated circuit being linked to an input node, wherein the input node receives in input mode an input signal, including a first value, through at least one resistor and wherein the input node is connected to a reference voltage through a second resistor and to zero volt through a third resistor, the method comprising:

using the input/output pin of the integrated circuit in input mode by receiving the first value;

toggling the input/output pin in a test mode after each of a plurality of instances of using the input/output pin in the input mode, wherein the test mode comprises using the input/output pin as an output providing a second value, different from the first value, during a set time after using the input/output pin in the input mode, receiving back on the input/output pin, during the set time a resulting value based on providing the second value and using the first, second and third resistors, measuring the resulting value, and identifying an error on the input/output pin of the integrated circuit based on the measured resulting value by comparing the resulting value and the second value; and wherein the identified error indicates that the input/output pin of the integrated circuit is stuck in a high/low level or if the first value includes a multiplexer addressing error.

2. The method of claim 1, further comprising:

outputting a pulse to provide the second value as an output pulse value at an output of the integrated circuit in the test mode;

reading the output pulse internally to receive back on the input/output pin the resulting value by obtaining the output pulse value;

measuring the output pulse value as the measured resulting value; and comparing the output pulse value read from the output with the second value, wherein the identified error is identified based on the comparing.

3. The method of claim 1, wherein the using the input/output pin in the first mode comprises reading the first value from a first received analog input from the input/output pin after conversion by an analog to digital converter;

wherein the toggling in the test mode comprises reconfiguring the input/output pin first for digital output in the test mode after receiving the first received analog input; and wherein the providing comprises setting the second value as a digital output value level for output from the input/output pin reconfigured for digital output in the test mode during the set time;

wherein the method further comprises:

charging or discharging a capacitor at the input/output pin reconfigured for digital output in the test mode to maintain a voltage level after setting the second value as the digital output value during the set time;

reconfiguring the input/output pin second for analog input again in the test mode after setting the second value as the digital output value during the set time;

measuring the voltage level at the input/output pin/voltage level of the capacitor to obtain the measured resulting value after conversion by the analog to digital converter, and comparing the measured resulting value/voltage level obtained from the input/output pin with the second value/digital output value level, wherein the identified error is identified based on the comparing.

4. The method of claim 1, wherein the integrated circuit comprises a microcontroller, used to control a light emitting diode driving circuit.

5. The method of claim 4, wherein the light emitting diode driving circuit complies with class 2 requirements for light emitting diodes, and wherein the microcontroller complies with an Underwriter Laboratories 60730 standard.

6. The method of claim 3, wherein the identified error indicates that first received analog input for the input/output pin has a multiplexer addressing error.

7. The method of claim 6, further comprising:

converting the first received analog input and the measured resulting value/voltage level to digital output using the analog to digital converter; and setting the input/output pin reconfigured first for digital output to a HIGH level or a LOW level, wherein the capacitor is connected to the input/output pin reconfigured for digital output to maintain the voltage level during the set time.

8. The method of claim 7, further comprising:

determining whether the measured resulting value/voltage level at the input/output pin indicates that the input/output pin is set to the HIGH level or the LOW level, and identifying an analog input multiplexer addressing error based on the determination and the comparing.

9. A control circuit comprising:

an integrated circuit including a microprocessor operable to execute instructions to detect errors on an input/output pin of the integrated circuit, the input/output pin of the integrated being linked to an input node, a first resistor connected to the input node and receiving an input signal, including a first value, in an input mode, a second resistor connected between a reference voltage and the input node a third resistor connected between a zero voltage and the input node, wherein, when executed by the microprocessor, the instructions cause a light emitting diode driving circuit to perform a process comprising:

using the input/output pin of the integrated circuit in the input mode by receiving a first value;

toggling the input/output pin in a test mode after each of a plurality of instances of using the input/output pin in the first mode, wherein the test mode comprises using the input/output pin at an output providing a second value, different from the first value, during a set time after using the input/output pin in the input mode, receiving back on the input/output pin, during the set time a resulting value based on providing the second value and using the first, second and third resistors, measuring the resulting value, measuring the resulting value, and identifying an error on the input/output pin of the microprocessor based on the measured resulting value by comparing the resulting value and the second value; and wherein the identified error indicates that the input/output pin of the integrated circuit is stuck in a high/low level or if the first value includes a multiplexer addressing error.

10. The control circuit of claim 9,
wherein the input mode is a mode in which the integrated circuit is primarily used.

11. The control circuit of claim 9,
wherein the input/output pin is configured for analog input in the first mode, and
wherein the toggling comprises reconfiguring the input/output pin from being configured for analog input to being configured for digital output.

12. The control circuit of claim 9, wherein the control circuit further comprises a fourth resistor linking the input/output pin of the integrated circuit to the input node.

13. The control circuit of claim 9, wherein the control circuit further comprises a capacitor connected in parallel with the third resistor.

14. The control circuit of claim 9, wherein said control circuit is in an output section of the light emitting diode driving circuit having a primary control section and the output section isolated from the primary control section.

* * * * *